United States Patent
Colbert et al.

(10) Patent No.: US 7,731,146 B2
(45) Date of Patent: Jun. 8, 2010

(54) DUAL SWIVEL IN-LINE LOAD NODE LOCK MECHANISM

(75) Inventors: John Lee Colbert, Byron, MN (US); Eric James Mckeever, Poughkeepsie, NY (US); John Allan Shurdalsvold, Byron, MN (US); Daniel A. Wright, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 12/240,478

(22) Filed: Sep. 29, 2008

(65) Prior Publication Data
US 2010/0078397 A1     Apr. 1, 2010

(51) Int. Cl.
*F16M 13/00* (2006.01)
(52) U.S. Cl. ............... 248/424; 248/298.1; 248/429
(58) Field of Classification Search ............ 248/424, 248/429, 298.1; 312/249.4, 9.3, 9.47
See application file for complete search history.

(56) References Cited

U.S. PATENT DOCUMENTS

| | | | |
|---|---|---|---|
| 5,460,441 A | 10/1995 | Hastings et al. | |
| 5,668,696 A | 9/1997 | Schmitt | |
| 5,730,412 A * | 3/1998 | Shrock | 248/429 |
| 6,290,199 B1 * | 9/2001 | Garrido et al. | 248/424 |
| 6,637,712 B1 * | 10/2003 | Lagerweij | 248/429 |
| 7,258,568 B2 | 8/2007 | Shih | |
| 7,293,752 B2 * | 11/2007 | McCulloch et al. | 248/429 |
| 2007/0215778 A1 * | 9/2007 | Kadlec et al. | 248/429 |

* cited by examiner

*Primary Examiner*—Amy J Sterling
(74) *Attorney, Agent, or Firm*—Cahn & Samuels LLP

(57) ABSTRACT

An in-line node locking mechanism for supporting and locking a node within a rack system such forces applied on a node by the node locking mechanism generate consistent output forces. The in-line node locking mechanism utilizes dual swivel nuts and an in-line loading arrangement that evenly distributes forces along the length of a rail system to create evenly distributed forces and avoid the creation of stress points. An actuating screw causes the node locking mechanism to adjust between unlocked and locked positions. In the unlocked position, the mechanism causes the node to be lowered and move freely along the in-line rail system. In the locked position the mechanism causes the node to securely abut the rack system thereby locking the node within the rack system.

1 Claim, 2 Drawing Sheets

DUAL SWIVEL IN-LINE LOAD NODE LOCK MECHANISM

I. FIELD OF THE INVENTION

This invention relates to a system and method for supporting and docking a node such that a consistent output force is generated by a given input. Specifically, the invention relates to a node locking mechanism that utilizes dual swivel nuts and an in-line loading arrangement that generates consistent output force per given torque thereby minimizing the creation of binding, wear and debris.

II. BACKGROUND OF THE INVENTION

Electrical computing and networking components, such as servers, are increasingly manufactured as modular components or modular nodes. These modular nodes allow computing and networking systems to be constructed in a "building-block" fashion within large modular assemblies or rack systems. The rack systems are typically designed to house multiple nodes that are often very large and/or heavy.

The size and weight of the nodes can make them difficult to handle and install in the rack systems. The rack systems typically include load bearing arrangements designed to support the nodes. These load bearing systems often include adjustable mechanisms, such as rails, that extend out of the rack so that the node can be more easily mounted onto the rails and then moved into position within the rack.

The load bearing arrangements may include a locking mechanism that locks or docks the node in the rack. The locking mechanism may include, for example, a height adjustable feature that is torque actuated. The load bearing arrangements including locking mechanisms are susceptible to various deficiencies due to their many moving parts and the substantial weight of the nodes that they support. These deficiencies include poor tolerances, degradation, uneven torque, and assorted other mechanical problems. These deficiencies tend to produce conductive wear debris which is extremely harmful to the nodes and other system components.

III. SUMMARY OF THE INVENTION

In at least one exemplary embodiment the present invention provides an apparatus including an outer extrusion rail having swivel nut holes proximate one end and at least two sets of dowel pin holes spaced longitudinally along the outer extrusion rail; an inner extrusion rail having swivel nut holes proximate one end and at least two sets of ramps spaced longitudinally along the inner extrusion rail, wherein said sets of ramps are spaced substantially the same distance apart as said sets of dowel pin holes; a bushing disposed in each of said ramps; said bushings attached to said outer extrusion rail by a dowel pin placed through each of said bushings and through each of said sets of dowel pin holes; a through swivel nut disposed in said swivel nut holes on said outer extrusion rail; a threaded swivel nut disposed in said swivel nut holes on said inner extrusion rail; a threaded actuating screw placed through said through swivel nut; and said threaded actuating screw engaging said threaded swivel nut, wherein adjusting the threaded actuating screw changes the position of said inner extrusion rail with respect to said outer extrusion rail.

In at least one exemplary embodiment the present invention provides a method including providing an outer extrusion rail having swivel nut holes proximate one end and at least two sets of dowel pin holes spaced longitudinally along the outer extrusion rail; providing an inner extrusion rail having swivel nut holes proximate one end and at least two sets of ramps spaced longitudinally along the inner extrusion rail, wherein said sets of ramps are spaced substantially the same distance apart as said sets of dowel pin holes; disposing a bushing in each of said ramps; attaching said bushings to said outer extrusion rail by placing a dowel pin through each of said bushings and through each of said sets of dowel pin holes; disposing a through swivel nut in said swivel nut holes on said outer extrusion rail; disposing a threaded swivel nut in said swivel nut holes on said inner extrusion rail; placing a threaded actuating screw through said through swivel nut; and engaging said threaded actuating screw with said threaded swivel nut, wherein adjusting the threaded actuating screw changes the position of said inner extrusion rail with respect to said outer extrusion rail.

IV. BRIEF DESCRIPTION OF THE DRAWINGS

The present invention is described with reference to the accompanying drawings, wherein.

Given the following enabling description of the drawings, the apparatus should become evident to a person of ordinary skill in the art.

V. DETAILED DESCRIPTION OF THE DRAWINGS

The present invention, in at least one embodiment, discloses a system and method for supporting and docking a node such that a consistent output force is generated by a given input. The system provides an efficient design that simplifies and reduces the moving parts. The system thereby avoids producing conductive wear debris that may harm the system.

Figure 1:
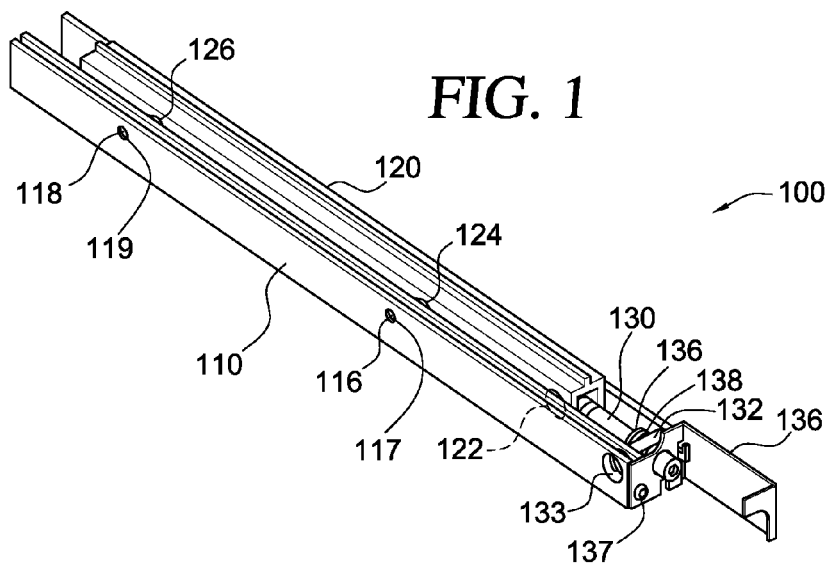
FIG. 1 illustrates an exemplary embodiment of the dual in-line node lock mechanism of the present invention.

FIG. 1 illustrates an exemplary embodiment of the dual in-line node lock mechanism of the present invention. The node lock mechanism 100 includes an outer extrusion rail 110, an inner extrusion rail 120, an actuating screw 130, a through swivel nut 132, a threaded swivel nut 134 (not shown), bushings 112, 114 (not shown), and dowel pins 116, 118. The dual in-line node lock mechanism is arranged such that the outer extrusion 110 and inner extrusion 120 move with respect to each other in an in-line fashion in both longitudinal and vertical directions.

Figure 2:
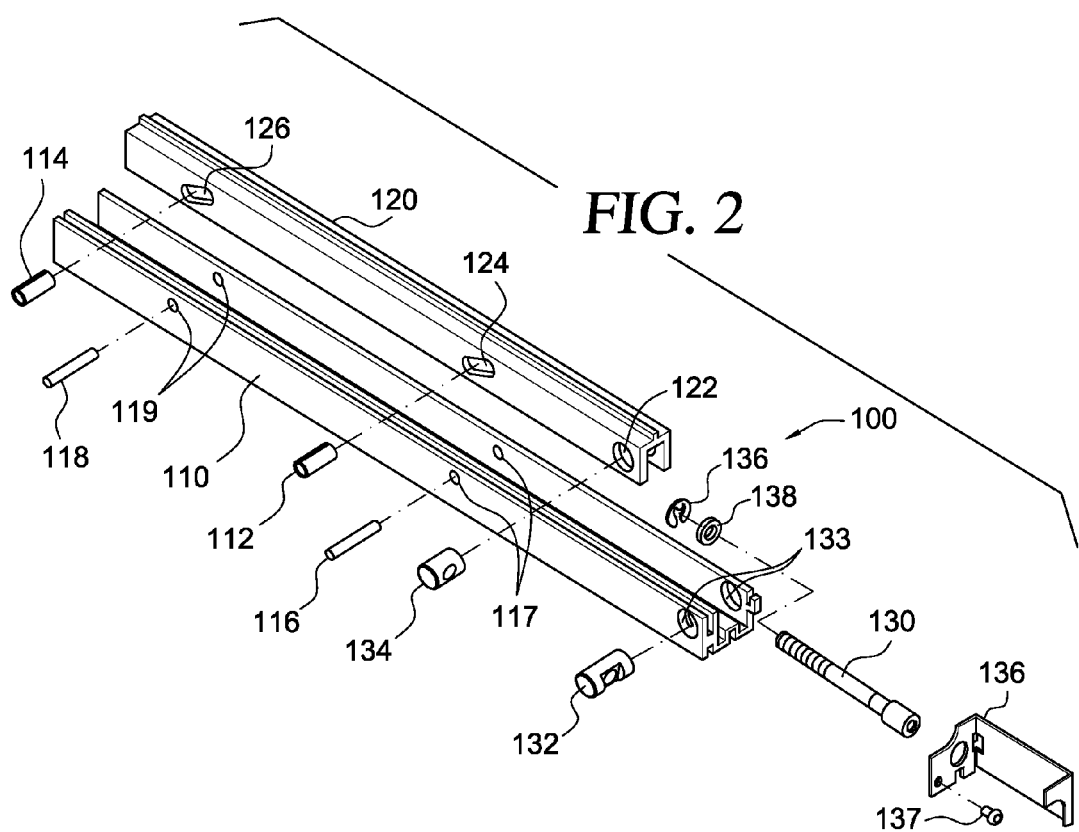
FIG. 2 illustrates an exploded view showing various components of the in-line node locking mechanism of the present invention.

FIG. 2 illustrates an exploded view showing various components of the in-line node locking mechanism of the present invention. The outer extrusion rail 110 attaches to a rack system (not shown). The inner extrusion rail 120 attaches to the outer extrusion rail 110 in order to movably support and lock a node (not shown) within the rack system. The inner extrusion rail 120 is attached to the outer extrusion 110 via bushings 112, 114 disposed in ramps 124, 126 in the inner extrusion 120. The bushings 112, 114 attach to the outer extrusion rail 110 via dowel pins 116, 118 placed in longitudinally spaced dowel pin holes 117, 119.

The actuating screw 130 attaches to both the outer extrusion rail 110 and inner extrusion rail 120 in order to move the rails with respect to each other. The actuating screw 130 may be, for example, a hex driven screw that includes threads. The actuating screw 130 attaches to the outer extrusion rail 110 via a through swivel nut 132 and the inner extrusion rail 120 via a threaded swivel nut 134. The actuating screw passes through the through swivel nut and is secured to the through swivel nut by, for example, a washer 138 and clip 136. The through swivel nut 132 is disposed in swivel nut holes 133 proximate the end of the outer extrusion rail 110 to secure the actuating screw 130 to the outer extrusion rail 110. The threaded swivel nut 134 is disposed in swivel nut holes 122 to secure the actuating screw 130 to the inner extrusion 120. The invention may also include an optional pull clip 136 attached to the outer extrusion rail 110 such that the rail system may be more conveniently pulled from the rack system. The pull clip 136 may be attached by any of various attachment means, such as screw 137.

Figure 3A:
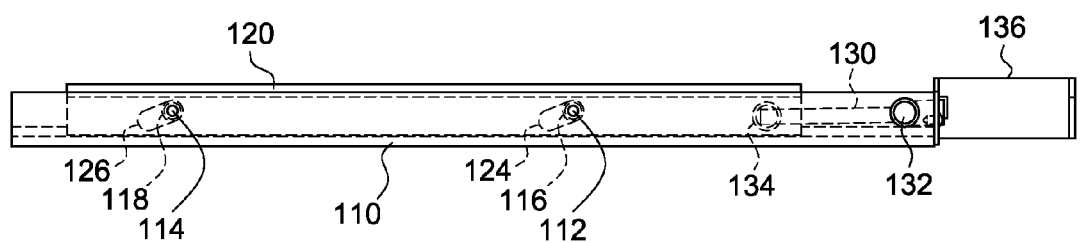
FIG. 3A illustrates an exemplary view of the in-line node locking mechanism of the present invention in an unactuated state.
Figure 3B:
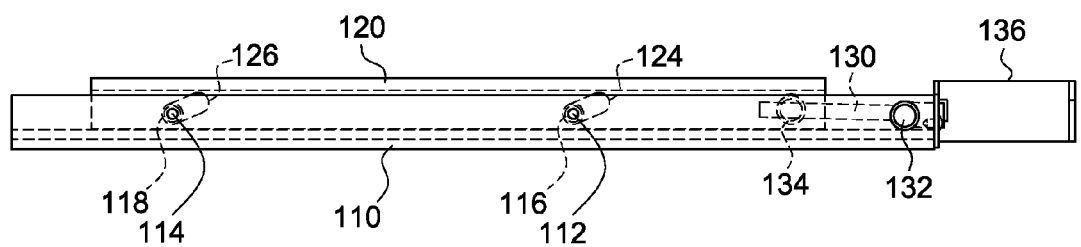
FIG. 3B illustrates and exemplary view of the in-line node locking mechanism in an actuated state.

FIGS. 3A and 3B illustrate exemplary views of the in-line node locking mechanism of the present invention in differing states of use. FIG. 3A outlines the in-line node locking mechanism in an unactuated or unlocked state. FIG. 3B outlines the in-line node locking mechanism in an actuated or locked state. When torqued the actuating screw 130 adjusts the position of the inner extrusion rail 120 up or down between an unactuated or unlocked position and an actuated or locked position. As the actuating screw 130 is torqued the threaded end of the screw—which engages the threaded swivel nut 134—moves the inner extrusion rail 120 along a longitudinal direction. The ramps 124, 126 in the inner extrusion rail 120 cause the height of the inner extrusion rail 120 to adjust depending on the direction of torque.

In the unactuated (unlocked) state, shown in FIG. 3A, the inner extrusion rail 120 is lowered with respect to the outer extrusion rail 110 via ramps 124, 126. In the unactuated state the node (not shown) supported by the node lock mechanism 100 is unlocked and is free to pull in and out of the rack system (not shown). In the actuated (locked) state, shown in FIG. 3B, the inner extrusion rail 120 is raised with respect to the outer extrusion rail 110 via ramps 124, 126. In the actuated state, the node supported by the node lock mechanism 100 is locked in the rack system by being raised such that it securely contacts the rack system. The inner extrusion rails 120 distribute forces evenly along the node. The even distribution of forces helps to avoid the creation of unevenly distributed forces and stress points thereby mitigating against the creation of binding, wear and debris.

Although the present invention has been described in terms of particular exemplary embodiments, it is not limited to those embodiments. Alternative embodiments, examples, and modifications which would still be encompassed by the invention may be made by those skilled in the art, particularly in light of the foregoing teachings.

Those skilled in the art will appreciate that various adaptations and modifications of the exemplary embodiments described above can be configured without departing from the scope and spirit of the invention. Therefore, it is to be understood that, within the scope of the appended claims, the invention may be practiced other than as specifically described herein.

We claim:

1. A method, comprising:

providing an outer extrusion rail having swivel nut holes proximate one end and at least two sets of dowel pin holes spaced longitudinally along the outer extrusion rail;

providing an inner extrusion rail having swivel nut holes proximate one end and at least two sets of ramps spaced longitudinally along the inner extrusion rail, wherein said sets of ramps are spaced substantially the same distance apart as said sets of dowel pin holes;

disposing a bushing in each of said ramps;

attaching said bushings to said outer extrusion rail by placing a dowel pin through each of said bushings and through each of said sets of dowel pin holes;

disposing a through swivel nut in said swivel nut holes on said outer extrusion rail;

disposing a threaded swivel nut in said swivel nut holes on said inner extrusion rail;

placing a threaded actuating screw through said through swivel nut;

engaging said threaded actuating screw with said threaded swivel nut, wherein adjusting the threaded actuating screw changes the position of said inner extrusion rail with respect to said outer extrusion rail.

* * * * *

UNITED STATES PATENT AND TRADEMARK OFFICE
CERTIFICATE OF CORRECTION

PATENT NO. : 7,731,146 B2
APPLICATION NO. : 12/240478
DATED : June 8, 2010
INVENTOR(S) : John Lee Colbert et al.

It is certified that error appears in the above-identified patent and that said Letters Patent is hereby corrected as shown below:

On the Title page, item (75), Inventors: "Mckeever" should read --McKeever--; and "Shurdalsvold" should read --Skurdalsvold--.

Signed and Sealed this

Twenty-eighth Day of September, 2010

David J. Kappos
*Director of the United States Patent and Trademark Office*